United States Patent
Kim et al.

(10) Patent No.: US 10,629,327 B2
(45) Date of Patent: Apr. 21, 2020

(54) CONDUCTIVE TRANSPARENT FILM

(71) Applicant: LG CHEM, LTD., Seoul (KR)

(72) Inventors: Dong Ryul Kim, Daejeon (KR); Young Bae Ahn, Daejeon (KR); Dong Yeop Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 98 days.

(21) Appl. No.: 15/771,628

(22) PCT Filed: May 8, 2017

(86) PCT No.: PCT/KR2017/004751
§ 371 (c)(1),
(2) Date: Apr. 27, 2018

(87) PCT Pub. No.: WO2017/196034
PCT Pub. Date: Nov. 16, 2017

(65) Prior Publication Data
US 2018/0322984 A1    Nov. 8, 2018

(30) Foreign Application Priority Data

May 9, 2016    (KR) .................... 10-2016-0056329
May 2, 2017    (KR) .................... 10-2017-0056216

(51) Int. Cl.
*H01B 5/14*    (2006.01)
*H01B 1/02*    (2006.01)
(Continued)

(52) U.S. Cl.
CPC .............. *H01B 5/14* (2013.01); *B32B 7/00* (2013.01); *C09D 7/40* (2018.01); *C09D 201/00* (2013.01);
(Continued)

(58) Field of Classification Search
CPC .......... B32B 7/00; C09D 201/00; C09D 7/40; C09D 7/61; C09D 7/63; C23C 14/08; C23C 14/34; G06F 2203/04103; G06F 3/041; H01B 13/0026; H01B 1/02; H01B 1/08; H01B 5/14; H05B 33/28;
(Continued)

(56) References Cited

U.S. PATENT DOCUMENTS 6,787,253 B2 * 9/2004 Iwabuchi ............ G06F 3/045
345/173
2003/0087119 A1 * 5/2003 Iwabuchi ............ G06F 3/045
428/633

FOREIGN PATENT DOCUMENTS

CN    104451610 A    3/2015
JP    2012-061683 A    3/2012
(Continued)

OTHER PUBLICATIONS

Hong, Mar. 12, 2014, Translation of KR 20140030666 (Year: 2014).*
(Continued)

*Primary Examiner* — Dmitriy Bolotin
(74) *Attorney, Agent, or Firm* — Dentons US LLP

(57) ABSTRACT

The present application relates to a conductive transparent film. The conductive transparent film comprises an undercoating layer, an anti-crack buffer layer, and a conductive layer. The conductive transparent film may have not only excellent mechanical strength, but also have a fast response speed when applied to a touch panel.

14 Claims, 2 Drawing Sheets

(51) Int. Cl.

| | | |
|---|---|---|
| *C09D 7/40* | (2018.01) | |
| *C09D 201/00* | (2006.01) | |
| *H05B 33/28* | (2006.01) | |
| *C23C 14/08* | (2006.01) | |
| *B32B 7/00* | (2019.01) | |
| *H05K 3/38* | (2006.01) | |
| *C23C 14/34* | (2006.01) | |
| *G06F 3/041* | (2006.01) | |
| *H01B 13/00* | (2006.01) | |
| *C09D 7/63* | (2018.01) | |
| *C09D 7/61* | (2018.01) | |
| *H05K 3/02* | (2006.01) | |
| *H01B 1/08* | (2006.01) | |

(52) U.S. Cl.
CPC .............. *C23C 14/08* (2013.01); *C23C 14/34* (2013.01); *G06F 3/041* (2013.01); *H01B 1/02* (2013.01); *H01B 13/0026* (2013.01); *H05B 33/28* (2013.01); *H05K 3/388* (2013.01); *C09D 7/61* (2018.01); *C09D 7/63* (2018.01); *G06F 2203/04103* (2013.01); *H01B 1/08* (2013.01); *H05K 3/022* (2013.01); *H05K 2201/0108* (2013.01); *H05K 2201/0326* (2013.01); *H05K 2201/10128* (2013.01)

(58) Field of Classification Search
CPC ... H05K 2201/0108; H05K 2201/0326; H05K 2201/10128; H05K 3/022; H05K 3/388
See application file for complete search history.

(56) References Cited

FOREIGN PATENT DOCUMENTS

| | | |
|---|---|---|
| JP | 2015-221938 A | 12/2015 |
| KR | 10-2009-0121186 A | 11/2009 |
| KR | 10-2011-0098706 A | 9/2011 |
| KR | 10-2011-0106539 A | 9/2011 |
| KR | 10-2014-0147420 A | 12/2014 |
| KR | 10-1525286 B1 | 6/2015 |
| KR | 10-2016-0038623 A | 4/2016 |
| KR | 10-2016-0038624 A | 4/2016 |
| TW | 579328 B | 3/2004 |
| TW | 201305698 A1 | 2/2013 |
| TW | 201401303 A | 1/2014 |
| TW | 201410814 A | 3/2014 |
| TW | 201543507 A | 11/2015 |

OTHER PUBLICATIONS

Jang, Apr. 7, 2016 Translation of KR 20160038624 (Year: 2016).*
Office Action of Chinese Patent Office in Appl'n. No. 201780004141.2, dated Mar. 14, 2019.

\* cited by examiner

[Figure 1]
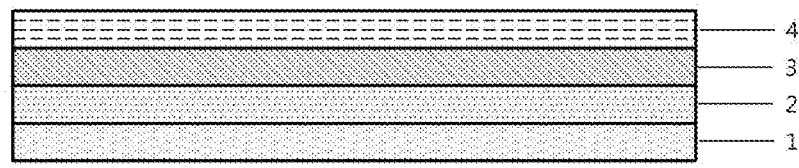
[Figure 2a]
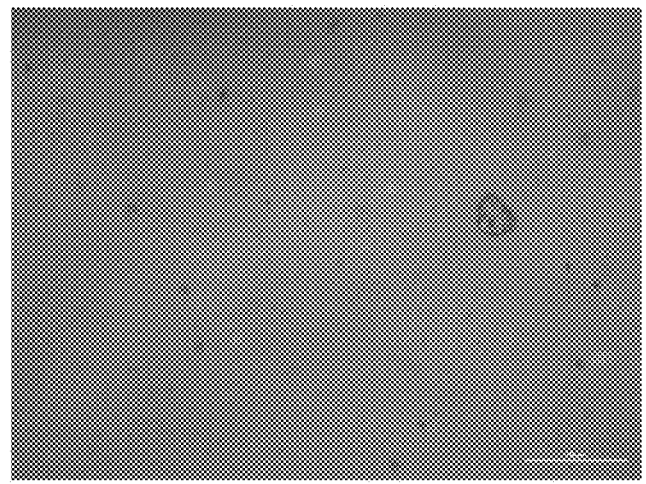
[Figure 2b]
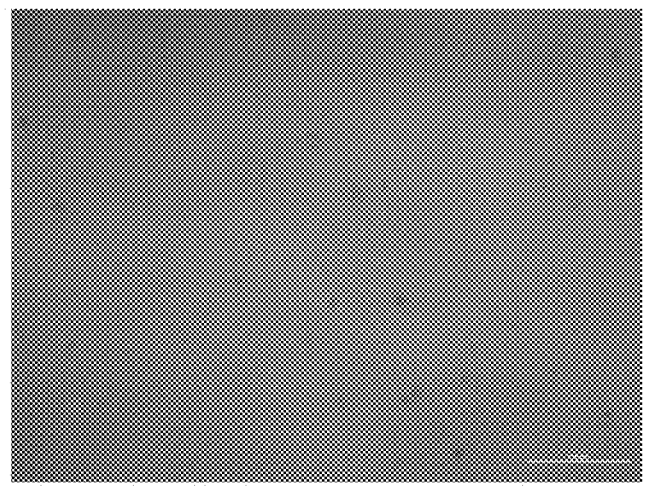

[Figure 2c]
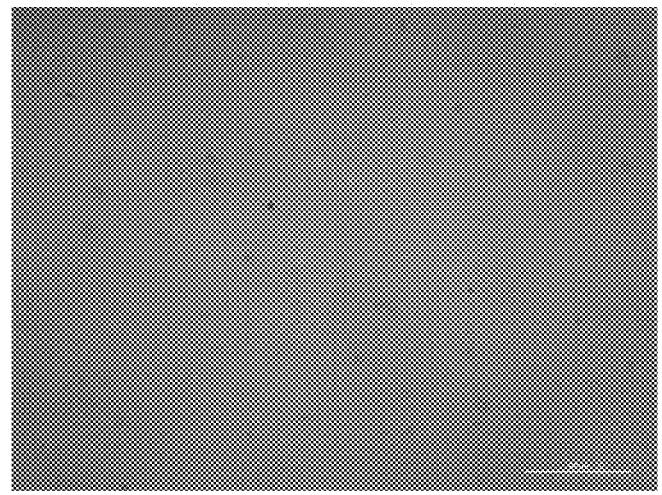

CONDUCTIVE TRANSPARENT FILM

CROSS-REFERENCE TO RELATED APPLICATIONS

This application is a National Stage Application of International Application No. PCT/KR2017/004751 filed on May 8, 2017, and claims the benefit of priority based on Korean Patent Application No. 10-2016-0056329 filed on May 9, 2016 and Korean Patent Application No. 10-2017-0056216 filed on May 2, 2017, the disclosures of which are herein incorporated by reference in their entireties.

TECHNICAL FIELD

The present application relates to a conductive transparent film.

BACKGROUND ART

The conductive transparent film is generally configured so as to comprise a transparent base material and an ITO thin film (layer). The film thus configured can be used for an imaging device such as a display, a touch panel, or the like. In this regard, since the recent trend is enlargement of the display or touch panel area, it is important to lower specific resistance of the conductive transparent film and each component used therein.

On the other hand, attempts have been made to improve the optical characteristics of the conductive transparent film through refractive index matching between the ITO layer and the transparent base material. For example, for the refractive index matching, a so-called undercoating layer may be placed between the ITO layer and the transparent base material. However, upon the deposition process for forming the ITO layer, the undercoating layer formed of the organic substance may be damaged, and the organic substance derived from the undercoating layer may contaminate the ITO layer, and thus there is a problem that the specific resistance of the ITO layer increases. Such an increase of the specific resistance may cause the reaction time of the conductive transparent film to be further delayed, as well as does not meet the technical demand due to the enlargement of the display or touch panel area. Furthermore, insufficient adhesion between the damaged undercoating layer and the contaminated ITO layer causes deterioration of mechanical properties of the conductive transparent film.

DISCLOSURE

Technical Problem

It is one object of the present application to provide a conductive transparent film having improved interfacial adhesion and mechanical properties.

It is another object of the present application to provide a conductive transparent film having low specific resistance and improved electrical characteristics such as a response speed.

It is another object of the present application to provide a conductive transparent film having excellent optical characteristics.

The above objects of the present application and other objects can be all solved by the present application which is described in detail below.

Technical Solution

In one example of the present application, the present application relates to a conductive transparent film. The film may have a light transmittance of 75% or more. More specifically, the film may have a light transmittance of 80% or more, 85% or more, or 90% or more. Unless otherwise specifically defined, the term "light" in the present application may mean a visible light having a wavelength of 380 nm to 780 nm, more specifically, a visible light having a wavelength of 550 nm.

The conductive transparent film may comprise a conductive layer, an undercoating layer, and an anti-crack buffer layer.

In one example, the conductive layer may comprise a transparent conductive oxide. As the transparent conductive oxide, for example, ITO (indium tin oxide), $In_2O_3$ (indium oxide), IGO (indium gallium oxide), FTO (fluor doped tin oxide), AZO (aluminum doped zinc oxide), GZO (gallium doped zinc oxide), ATO (antimony doped tin oxide), IZO (indium doped zinc oxide), NTO (niobium doped titanium oxide), ZnO (zinc oxide), or CTO (cesium tungsten oxide), and the like can be used.

In another example, the conductive layer may comprise indium oxide as a transparent conductive oxide. More specifically, the conductive layer may comprise an indium-based composite oxide containing indium oxide and an oxide of a tetravalent metal. The oxide of the tetravalent metal may be represented by the following formula 1.

$$AO_2 \qquad \text{[Formula 1]}$$

In Formula 1 above, A may be a tetravalent metal selected from the group consisting of Sn, Zr, Ge, Ti, Ce, Nb, Ta, Mb and W.

In one example, the oxide of the tetravalent metal represented by Formula 1 above may be included in an amount of 1 to 20 parts by weight relative to 100 parts by weight of the total indium-based composite oxide constituting the conductive layer. In the present application, the term part by weight may mean a content ratio between the components. If the lower limit of the above range is not satisfied, the electrical characteristics of the conductive layer, for example, sheet resistance and conductivity are poor. In addition, when the upper limit of the above range is not satisfied, the crystallization temperature is increased and thus the process energy efficiency for forming the conductive layer is poor.

In one example, the conductive layer may have a thickness of 100 nm or less. More specifically, the conductive layer may have a thickness of 80 nm or less, or 50 nm or less, and 5 nm or more, or 10 nm or more. When the thickness range is satisfied, a conductive layer having evenly excellent mechanical properties, transmittance and sheet resistance may be provided.

Without being particularly limited, the conductive layer may have an optical refraction index of 1.7 to 2.3.

The undercoating layer may be a layer included for improving the optical characteristics of the conductive transparent film, that is, for increasing the visible light transmittance of the film. For example, when the conductive transparent film further comprises a base material layer in addition to the above-described conductive layer, the optical refraction index of the undercoating layer may have a value different from the optical refraction index of the base material layer and/or the optical refraction index of the conductive layer. More specifically, the undercoating layer may have an optical refraction index in the range of 1.5 to 2.0 on the premise of being different from the optical refraction index of the base material layer and/or the optical refraction index of the conductive layer. When the above range and relationship are satisfied, the visible light transmittance of the conductive transparent film can be increased.

The undercoating layer may comprise an organic substance, an inorganic substance, or a mixture thereof.

In one example, the undercoating layer may comprise a resin capable of thermosetting or photo-curing as an organic substance. Without being particularly limited, for example, at least one from an acrylic resin, a urethane resin, a thiourethane resin, a melamine resin, an alkyd resin, a siloxane polymer and an organosilane compound represented by Formula 2 below may be used as an organic substance:

$$(R^1)_m—Si—X_{(4-m)}$$ [Formula 2]

in Formula 2 above, $R^1$ may be the same or different from each other and is alkyl having 1 to 12 carbon atoms, alkenyl, alkynyl, aryl, arylalkyl, alkylaryl, arylalkenyl, alkenylaryl, arylalkynyl, alkynylaryl, halogen, substituted amino, amide, aldehyde, keto, alkylcarbonyl, carboxy, mercapto, cyano, hydroxy, alkoxy having 1 to 12 carbon atoms, alkoxycarbonyl having 1 to 12 carbon atoms, sulfonic acid, phosphoric acid, acryloxy, methacryloxy, epoxy or a vinyl group, X may be the same or different from each other and is hydrogen, halogen, alkoxy having 1 to 12 carbon atoms, acyloxy, alkylcarbonyl, alkoxycarbonyl, or —N(R$^2$)$_2$ (where $R^2$ is H, or alkyl having 1 to 12 carbon atoms), where oxygen or —NR$^2$ (where $R^2$ is H, or alkyl having 1 to 12 carbon atoms) may also be inserted between a radical $R^1$ and Si to form $(R^1)_m$—O—Si—$X_{(4-m)}$ or $(R^1)_m$—NR$^2$—Si—$X_{(4-m)}$, and m is an integer of 1 to 3.

When the organosilane compound as above is used in the undercoating layer, the organosilane compound may be cross-linkable and may be mixed with highly refractive particles to control the refractive index. The type of highly refractive particles is not particularly limited.

The kind of the organosilane compound is not particularly limited. For example, methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylethoxysilane, dimethylethoxysilane, diphenylmethoxysilane, diphenylethoxysilane, 3-aminopropyltriethoxysilane, 3-glycidoxypropyltrimethoxysilane, p-aminophenylsilane, allyltrimethoxysilane, n-(2-aminoethyl)-3-aminopropyltrimethoxysilane, 3-aminopropyltriethoxysilane, 3-aminopropyltrimethoxysilane, 3-glycidoxypropyldiisopropylethoxysilane, (3-glycidoxypropyl)methyldiethoxysilane, 3-glycidoxypropyltrimethoxysilane, 3-mercaptopropyltrimethoxysilane, 3-mercaptopropyltriethoxysilane, 3-methacryloxypropylmethyldiethoxysilane, 3-methacryloxypropylmethyldimethoxysilane, 3-methacryloxypropyltrimethoxysilane, n-phenylaminopropyltrimethoxysilane, vinylmethyldiethoxysilane, vinyltriethoxysilane, or vinyltrimethoxysilane, and the like can be used as the organosilane compound.

The undercoating layer may comprise an inorganic substance. For example, an inorganic substance such as $TiO_2$, $Nb_2O_5$, $Ta_2O_5$, $Sb_2O_5$, $ZrO_2$, ZnO, ZnS or a metal alkoxide compound represented by the following formula 3 may be included in the undercoating layer.

$$M-(R^3)_z$$ [Formula 3]

wherein, M represents a metal selected from the group consisting of aluminum, zirconium, titanium, and silicon, $R^3$ may be the same or different from each other and is halogen, alkyl having 1 to 12 carbon atoms, alkoxy, acyloxy, or hydroxy and Z is an integer of 2 or 4.

When the undercoating layer comprises a mixture of an organic substance and an inorganic substance, the organic substance may be contained in an amount of 0.001 to 100 parts by weight relative to 100 parts by weight of the entire mixture.

In one example, the undercoating layer may have a thickness of 150 nm or less. Specifically, the undercoating layer may have a thickness of 130 nm or less, 110 nm or less, or 100 nm or less. When the thickness of the undercoating layer is more than 150 nm, transmittance and color difference index of the conductive transparent film may be lowered. The thickness lower limit of the undercoating layer is not particularly limited, but may be 1 nm or more in consideration of processability, or function of the undercoating layer.

The conductive transparent film of the present application may further an anti-crack buffer layer. In one example, the anti-crack buffer layer may be positioned between the undercoating layer and the conductive layer. The anti-crack buffer layer can contribute to reduction of surface resistance of the conductive layer and improvement of interfacial adhesion between layers. In addition, even when the anti-crack buffer layer is included, the film of the present application can maintain a high level of transmittance corresponding to the above-described range.

For example, in the prior art that one surface of the undercoating layer is configured so as to be directly contacted with one surface of the conductive layer, that is, the conductive layer is directly formed on one surface of the undercoating layer, the conductive layer has been frequently contaminated by the organic substance in the undercoating layer and thus a conductive layer having a resistance value of at least 100 Ω/□ or more, usually 150 Ω/□ or more, or 250 Ω/□ or more has been generally used for the conductive transparent film. Under such a condition, it is difficult to expect improvement of a response speed by the conductive transparent film. On the other hand, considering the configuration generally used for the conductive transparent film, it is not easy to lower the resistance value of the conductive layer. For example, even if there is an attempt to lower the resistance value, it is very difficult to lower the resistance value of the conductive layer by a size of 5Ω/□. The closer the resistance of the conductive layer is to 150Ω/□ or less, particularly, 100Ω/□, the more so. However, the conductive transparent film of the present application may comprise an anti-crack buffer layer between the undercoating layer and the conductive layer, thereby preventing contamination of the interface of the conductive layer by the organic substance used in the undercoating layer and lowering the resistance value of the conductive layer. As a result, the response speed can be improved. For example, the conductive layer included in the conductive transparent film of the present application may have a surface resistance of 300Ω/□ or less, 200Ω/□ or less, 100Ω/□ or less, or 95Ω/□ or less. The lower the surface resistance value, the faster the response speed can be achieved, and thus the lower limit of the surface resistance value of the conductive layer is not particularly limited, but may be, for example, 10 Ω/□ or more or 20 Ω/□ or more. Moreover, in the present application, since the anti-crack buffer layer satisfying the following constitution is used, the optical characteristics of the film such as transparency do not deteriorate even if the layer structure is added.

In one example, the anti-crack buffer layer may comprise a metal oxide. More specifically, the anti-crack buffer layer may comprise $NbO_x$. Here, X may have a value in the range of 1 to 2.5 as a content ratio between elements. With the above range, a predetermined effect, for example, thin film reliability, high transmittance, and excellent mechanical properties can be provided. Conversely, when the above range is not satisfied, the transmittance is lowered, and it is difficult to laminate it with other layers. The X may be measured using a known method, for example, XPS (X-ray photoelectron spectroscopy) or the like.

The anti-crack buffer layer may have a thickness in a range of 0.1 nm to 20 nm. If the thickness of the anti-crack buffer layer is less than 0.1 nm, it is difficult to obtain effects such as reduction of the surface resistance by the buffer layer or increase of the interfacial adhesion, and if the thickness exceeds 20 nm, optical properties and mechanical properties may be deteriorated. In one example, considering the optical properties such as light transmittance and the mechanical properties such as crack prevention, the anti-crack buffer layer may be formed to have the thickness in the range of 0.1 nm to 5 nm or 0.5 nm to 3 nm.

Since the anti-crack buffer layer has excellent interfacial adhesion to the undercoating layer and the conductive layer, it is possible to suppress the occurrence of cracks in the conductive transparent film and to improve the mechanical properties thereof. For example, since the anti-crack buffer layer has excellent interfacial adhesion, the occurrence degree of cracks generated in the conductive layer can be reduced, when an external pressure such as bending is applied to the conductive transparent film.

More specifically, the conductive transparent film of the present application may comprise a conductive layer having a crack density value of 80 cracks/mm$^2$ or less. The crack density may be a value measured by bending a specimen, in which the conductive transparent film is tailored to a size of 1 mm×1 mm, with vernier calipers and then dividing the combined length value of the entire crack generated in the conductive layer by 100 μm. Since the value of the crack density becomes smaller as the interfacial adhesion is better, the lower limit of the crack density value is not particularly limited. In one example, the lower limit of the crack density value may be 1 crack/mm$^2$ or more, 5 cracks/mm$^2$ or more, or 10 cracks/mm$^2$ or more.

In one example, the conductive transparent film may further comprise a base material (substrate layer). In this case, the conductive transparent film may comprise a base material, an undercoating layer, an anti-crack buffer layer, and a conductive layer in this order.

In one example, the base material layer may comprise a flexible plastic film having transmittance. If it is optically transparent and flexible, the kind of the film used for the base material layer is not particularly limited. In one example, a polyester film such as a PC (polycarbonate) film or a PEN (poly(ethylene naphthalate)) film or a PET (poly(ethylene terephthalate)) film, an acrylic film such as a PMMA (poly(methyl methacrylate) film, a PA (polyamide) film, a PVC (poly(vinyl chloride)) film, a PS (polystyrene) film, a PES (poly(ethersulfone)) film, a PEI (poly(ether imide)) film, or a polyolefin film such as a PE (polyethylene) film or a PP (polypropylene) film, and the like may be used as the base material layer, without being limited thereto.

In one example, separate treatment such as corona discharge treatment, ultraviolet irradiation treatment or plasma treatment may be performed on the surface of the base material layer, in order to improve the interfacial adhesion with the adjacent layer.

In one example, the base material layer may have a thickness in the range of 5 μm to 150 μm. If the thickness is less than 5 μm, the mechanical strength may be poor, and if the thickness exceeds 150 μm, sensitivity of the touch panel may be poor.

Without being particularly limited, the base material layer may have an optical refraction index in a range of 1.4 to 1.7.

In one example of the present application, the present application relates to a method for manufacturing a conductive transparent film. The manufacturing method may comprise a step of sequentially providing an anti-crack buffer layer and a conductive layer on an undercoating layer. Specific components and characteristics of the undercoating layer, the anti-crack buffer layer and the conductive layer are as explained above.

In one example, the undercoating layer may be formed by applying an undercoating layer precursor composition onto a base material layer and then curing it. The composition may comprise the organic substance, the inorganic substance, or the mixture thereof, as described above. The curing conditions are not particularly limited and the known heat or photo-curing methods can be used.

In one example, the anti-crack buffer layer and the conductive layer may be formed by vapor deposition. The deposition method is not particularly limited, and a physical vapor deposition (PVD) method such as a sputtering method or an E-beam evaporation method may be used.

For example, the anti-crack buffer layer may be prepared through sputtering deposition. Without being particularly limited, the x value, which is a content ratio of niobium oxide (NbOx) forming the anti-crack buffer layer, may be adjusted to 1 to 2.5 by controlling the deposition process. When the deposition process is controlled so as to satisfy the range X, an anti-crack buffer layer having excellent process efficiency and high thin film stability is provided.

The conductive layer may also be prepared through sputtering deposition. For example, a conductive layer can be formed by causing argon ions to impact an oxide composite target containing indium oxide and the tetravalent metal oxide at a process pressure of 1 mtorr to 30 mtorr and a temperature of 100° C. to 500° C.

In another example of the present application, the present application relates to a device comprising the conductive transparent film. The device may be a display, a lighting device, a touch panel, or the like.

EXPLANATION OF REFERENCE NUMERALS

1: base material layer
2: undercoating layer
3: anti-crack buffer layer
4: conductive layer Effects of the Invention According to one example of the present application, it is possible to provide a conductive transparent film having not only excellent transmittance but also simultaneously improved mechanical properties and response speed.

BRIEF DESCRIPTION OF THE DRAWINGS

FIG. 1 schematically shows a cross-section of a conductive transparent film according to one example of the present application.

FIG. 2 is images photographed cracks generated on the surface of an experimental specimen. Specifically, FIG. 2a is an image photographed the surface of Example 1; FIG. 2b is an image photographed the surface of Example 2; and FIG. 2c is an image photographed the surface of Comparative Example 1.

DETAILED DESCRIPTION OF THE INVENTION

Hereinafter, the present application will be described in detail through Examples. However, the scope of protection of the present application is not limited by Examples described below.

The physical properties of Examples and Comparative Examples below were each evaluated in the following manner.

Physical Property Evaluation Method

<Surface Resistance>

After heat treating the conductive transparent film prepared in Examples and Comparative Examples at a temperature condition of 130° C. for 1 hour, the surface resistance ($\Omega/\square$) of the ITO conductive layer was measured through 4-probe measurement (Loresta EP MCP-T360).

<Transmittance>

After heat treating the conductive transparent film prepared in Examples and Comparative Examples at a temperature condition of 130° C. for 1 hour, the transmittance was measured using Hazemeter (HM-150, Murakami Color Research Laboratory) and UV-VIS-NIRSPECTROPHOTOMETER (UV-3600, SHIMADZU).

<Mechanical Properties>

Bend Length at the Time of Crack Occurrence

A protective film was attached to the conductive transparent film in the film form prepared in Examples and Comparative Examples, and the ITO layer was crystallized by heat treatment. Then, the film was cut into a size of 1 mm×1 mm to prepare a specimen. When the specimen was placed in a bending state with vernier calipers so that the crystallized ITO layer was located on the inner side and maintained for 30 seconds, the bend length at the time when cracks were generated in the ITO layer was measured.

Crack Density

In the ITO layer that cracks were generated, the length of 100 μm was regarded as one crack, and the lengths of the entire crack generated in the specimen were combined, and then the combined value was divided by 100 μm. As a result, cracks having different lengths and numbers were quantified.

Example 1

A solution containing a condensable organosilane compound (methyltrimethoxysilane) was coated on a transparent PET base material having a thickness of 50 μm and thermally cured to form an undercoating layer having a thickness of 40 nm. An anti-crack buffer layer comprising niobium oxide ($NbO_x$) was deposited on the undercoating layer to a thickness of 1 nm by using a sputtering technique, while targeting niobium (Nb) and supplying a mixed gas of argon and oxygen to the deposition equipment. Similarly, an indium oxide layer comprising $SnO_2$ was formed to a thickness of 21.3 nm on the anti-crack buffer layer using the sputtering technique to prepare a conductive transparent film. The constitution and physical properties of the prepared film are as shown in Tables 1 and 2, respectively.

Examples 2 to 5

As shown in the following Table 1, a film was prepared in the same manner as in Example 1, except for the thickness of the anti-crack buffer layer and the surface resistance value. The physical properties of the prepared film are as shown in Table 2.

Comparative Example 1

As shown in Table 1 below, a film was prepared in the same manner as in Example 1, except that the ITO layer was directly formed on the undercoating layer, without preparing the anti-crack buffer layer. The physical properties of the prepared film are as shown in Table 2.

TABLE 1

| | ITO Thickness (nm) | Composition of Anti-crack Buffer Layer | Thickness of Anti-crack Buffer Layer (nm) |
|---|---|---|---|
| Example 1 | 21.3 | $NbO_{1.5}$ | 1 |
| Example 2 | 21.3 | $NbO_{1.5}$ | 1.5 |
| Example 3 | 21.3 | $NbO_{1.5}$ | 2 |
| Example 4 | 21.3 | $NbO_{1.5}$ | 3 |
| Example 5 | 21.3 | $NbO_{1.5}$ | 5 |
| Comparative Example 1 | 21.3 | — | — |

TABLE 2

| | | | Mechanical Property | |
|---|---|---|---|---|
| | Surface Resistance Value ($\Omega/\square$) | Optical Property Transmittance (%) | Bend Length at the Time of Crack Occurrence (nm) | Crack Density (number/mm$^2$) |
| Example 1 | 92 | 91.6 | 16 | 31.8 |
| Example 2 | 94 | 91.2 | 16 | 48.6 |
| Example 3 | 93 | 90.8 | 16 | 46.9 |
| Example 4 | 94 | 90.5 | 16 | 77.2 |
| Example 5 | 93 | 89.8 | 17 | 12.4 |
| Comparative Example 1 | 98 | 91.6 | 16 | 84.3 |

The invention claimed is:

1. A conductive transparent film comprising a conductive layer; an undercoating layer; and an anti-crack buffer layer, wherein after bending said conductive transparent film having a size of 1 mm×1 mm with vernier calipers, a value of crack density is 80 cracks/mm$^2$ or less, which is measured by dividing the combined length value of the entire crack generated in the conductive layer by 100 μm.

2. The conductive transparent film according to claim 1, wherein said anti-crack buffer layer is positioned between the conductive layer and the undercoating layer.

3. The conductive transparent film according to claim 2, wherein said anti-crack buffer layer comprises a metal oxide.

4. The conductive transparent film according to claim 3, wherein said metal oxide is $NbO_x$ ($1 \leq X \leq 2.5$).

5. The conductive transparent film according to claim 3, wherein said anti-crack buffer layer has a thickness of 0.1 nm to 20 nm.

6. The conductive transparent film according to claim 1, wherein said conductive layer comprises a transparent conductive oxide.

7. The conductive transparent film according to claim 6, wherein said conductive layer has a thickness of 100 nm or less.

8. The conductive transparent film according to claim 7, wherein said conductive layer has a surface resistance value in a range of 20 Ω/sq to 95 Ω/sq.

9. The conductive transparent film according to claim 6, wherein said conductive layer has a surface resistance value in a range of 20 Ω/sq to 300 Ω/sq.

10. The conductive transparent film according to claim 1, wherein said undercoating layer comprises an organic substance, and said organic substance comprises at least one selected from an acrylic resin, a urethane resin, a thiourethane resin, a melamine resin, an alkyd resin, a siloxane polymer and an organosilane compound represented by Formula 2 below:

 [Formula 2]

in Formula 2 above, $R^1$ may be the same or different from each other and is alkyl having 1 to 12 carbon atoms, alkenyl, alkynyl, aryl, arylalkyl, alkylaryl, arylalkenyl, alkenylaryl, arylalkynyl, alkynylaryl, halogen, substituted amino, amide, aldehyde, keto, alkylcarbonyl, carboxy, mercapto, cyano, hydroxy, alkoxy having 1 to 12 carbon atoms, alkoxycarbonyl having 1 to 12 carbon atoms, sulfonic acid, phosphoric acid, acryloxy, methacryloxy, epoxy or a vinyl group, X may be the same or different from each other and is hydrogen, halogen, alkoxy having 1 to 12 carbon atoms, acyloxy, alkylcarbonyl, alkoxycarbonyl, or —N($R^2$)$_2$ (where $R^2$ is H, or alkyl having 1 to 12 carbon atoms), where oxygen or —N$R^2$ (where $R^2$ is H, or alkyl having 1 to 12 carbon atoms) may also be inserted between a radical $R^1$ and Si to form $(R^1)_m$—O—Si—$X_{(4-m)}$ or $(R^1)_m$—$NR^2$—Si—$X_{(4-m)}$, and m is an integer of 1 to 3.

11. The conductive transparent film according to claim 10, wherein said undercoating layer has a thickness of 150 nm or less.

12. The conductive transparent film according to claim 1, having a light transmittance of 75% or more.

13. A method for manufacturing the conductive transparent film according to claim 1, comprising a step of sequentially providing an anti-crack buffer layer and a conductive layer on an undercoating layer.

14. A touch panel comprising the conductive transparent film according to claim 1.

* * * * *